(12) United States Patent
Fornel et al.

(10) Patent No.: US 10,605,053 B2
(45) Date of Patent: Mar. 31, 2020

(54) METHOD FOR OPERATING A SUBSTERRANEAN FORMATION FROM WHICH A FLUID IS PRODUCED

(71) Applicant: IFP ENERGIES NOUVELLES, Rueil-Malmaison (FR)

(72) Inventors: Alexandre Fornel, Rueil Malmaison (FR); Mickaele Le Ravalec, Rueil Malmaison (FR)

(73) Assignee: IFP Energies nouvelles, Rueil-Malmaison (FR)

( * ) Notice: Subject to any disclaimer, the term of this patent is extended or adjusted under 35 U.S.C. 154(b) by 280 days.

(21) Appl. No.: 14/790,944

(22) Filed: Jul. 2, 2015

(65) Prior Publication Data
US 2016/0003010 A1 Jan. 7, 2016

(30) Foreign Application Priority Data

Jul. 4, 2014 (FR) ...................... 14 56465

(51) Int. Cl.
  *E21B 41/00* (2006.01)
  *E21B 43/30* (2006.01)
  *E21B 7/00* (2006.01)
  *G06F 17/50* (2006.01)

(52) U.S. Cl.
  CPC ............ *E21B 41/0092* (2013.01); *E21B 7/00* (2013.01); *E21B 43/30* (2013.01); *E21B 43/305* (2013.01); *G06F 17/5009* (2013.01)

(58) Field of Classification Search
  CPC ........ E21B 41/0092; E21B 7/00; E21B 43/30; E21B 43/305; G06F 17/5009
  See application file for complete search history.

(56) References Cited

U.S. PATENT DOCUMENTS

| 6,549,879 B1 * | 4/2003 | Cullick et al. | .......... E21B 49/00 702/11 |
| 6,810,332 B2 * | 10/2004 | Harrison | ................. E21B 49/00 702/13 |
| 6,980,940 B1 * | 12/2005 | Gurpinar | ................. E21B 43/00 166/250.16 |

(Continued)

OTHER PUBLICATIONS

J. S. de A. Cavalcante Filho, Methodology for quality map generation to assist with the selection and refinement of production stratehies, SPE 101940-STU 2005 p. 1-10.*

(Continued)

*Primary Examiner* — Rehana Perveen
*Assistant Examiner* — Chuen-Meei Gan
(74) *Attorney, Agent, or Firm* — Fitch, Even, Tabin & Flannery LLP (57) ABSTRACT

A method for operating an oil deposit based on a technique of positioning wells to be drilled is disclosed. Based on a grid representative of the petrophysical properties of a subterranean formation through at least one well is drilled, a reservoir simulation is performed up to a time for which production of the formation being studied is to be predicted. Then, attributes are selected that are representative of the flows in the formation and a classification of these attributes is performed. Then, a quality indicator is computed for each of the classes and at least one class is selected such that its quality indicator is greater than a first threshold.

32 Claims, 6 Drawing Sheets

(56) References Cited

U.S. PATENT DOCUMENTS

| | | | | |
|---|---|---|---|---|
| 2005/0015226 | A1* | 1/2005 | Le Ravalec-Dupin | ............... G01V 99/00 703/2 |
| 2006/0149520 | A1* | 7/2006 | Le Ravalec-Dupin | ............... G01V 11/00 703/10 |
| 2009/0259446 | A1* | 10/2009 | Zhang | ............... E21B 49/00 703/2 |
| 2011/0125469 | A1* | 5/2011 | Da Veiga | ............... G01V 11/00 703/2 |
| 2012/0109597 | A1* | 5/2012 | Derfoul | ............... E21B 43/00 703/2 |
| 2013/0020131 | A1* | 1/2013 | Le Ravalec | ............... E21B 43/30 175/50 |
| 2013/0218537 | A1* | 8/2013 | Le Ravalec | ............... G06F 17/5009 703/2 |
| 2013/0268248 | A1* | 10/2013 | Bouzarkouna | ............... G06Q 10/04 703/2 |
| 2013/0317798 | A1* | 11/2013 | Cheng | ............... E21B 43/30 703/10 |

OTHER PUBLICATIONS

Mickaele Le Ravalec, Optimization well placement with quality maps derived from multi-fidelity meta-modelsm, SPE 154416, 2012 p. 1-10.*

Hugo Caetano, Chapter 6: Integration of seismic information in reservoir models: global stochastic inversion, InTech New Technologies in the oil and gas industry, 2012, p. 119-150.*

J. S. de A. Cavalcante Filho, Methodology for quality map generation to assist with the selection and refinement of production stratehies, SPE 101940-STU 2005 p. 1-10 (Year: 2005).*

Mickaele Le Ravalec, Optimization well placement with quality maps derived from multi-fidelity meta-modelsm, SPE 154416, 2012 p. 1-10 (Year: 2012).*

Hugo Caetano, Chapter 6: Integration of seismic information in reservoir models: global stochastic inversion, InTech New Technologies in the oil and gas industry, 2012, p. 119-150 (Year: 2012).*

Sebastien Da Veiga et al, Maximum likelihood classification for facies inference from reservoir attributes, Comput. Geosci (2012) 16:709-722. (Year: 2012).*

* cited by examiner

METHOD FOR OPERATING A SUBSTERRANEAN FORMATION FROM WHICH A FLUID IS PRODUCED

CROSS-REFERENCE TO RELATED APPLICATION

This application claims the foreign priority filing date benefit of French Patent Application No 14/56.465, filed Jul. 4, 2014, and the full disclosure of the French application is incorporated herein by reference in its entirety.

BACKGROUND OF THE INVENTION

Field of the Invention

The present invention relates to the oil industry, and more particularly to the operation of oil deposits to produce fluids. In particular, the invention makes possible effectively planning the development of a deposit by selecting the positions for drilling new wells and the order in which to drill these new wells.

Description of the Prior Art

The optimization and operation of oil deposits relies on a description that is as an accurate as possible representative of the structure, the petrophysical properties, and the fluid properties, etc., of the deposit being studied. For this, a model is used of the subsoil which makes possible representing these aspects in an approximate manner which is the reservoir model. Generally, this type of model is represented on a computer, and it is then called a numerical model. A reservoir model comprises a meshing or grid, which is generally three-dimension, and is associated with one or more maps of petrophysical properties (porosity, permeability, saturation, etc.). The association assigns values of these petrophysical properties to each of the meshes of the grid.

A reservoir model should represent as far as possible all the data collected in the field which are the log data measured along the wells, the measurements performed on rock samples taken from the wells, the data deduced from seismic acquisition campaigns, and the production data such as flow rates of oil, of water, of pressure variations, etc. Since these data are insufficient to provide an exact definition of the values of the petrophysical properties to be assigned to each of the meshes of the model, a stochastic formalism is normally applied. For this type of formalism, the petrophysical properties are considered as realizations of random functions. One possible image of the reservoir, that is to say a model, is then generated based on geostatistical simulation techniques. The resolution of the flow equations for this model, obtained via a flow simulation, which called reservoir simulation and provides responses in production.

These responses are then compared to the production data measured in the wells. To increase the predictability of the reservoir model, it is then necessary to minimize the deviation between the simulated responses and the data acquired in the field. This step, known by the terminology leveling, is performed by an optimization process. The latter is generally requires a large amount of computation time, because it is iterative and requires a flow simulation for each iteration. As a result, a single flow simulation often involves several hours of computer computation time.

When a model observing all the data measured in the field is finally obtained, it is used to predict the fluid displacements in the reservoir and to plan for the future development of the deposit. For example, for the mature fields, it is essential to select the areas of the fluid in which to drill new wells, for either producing the oil by depletion, or injecting a fluid which maintains the pressure at a sufficient level in the reservoir. To assess the performance of a well at a position, it is possible to rely on the reservoir model, position the well at the desired position in the fluid and execute a reservoir simulation. The performance of a well is assessed based on the quantity of hydrocarbons that it produces. Since the final objective is to maximize the production or the cost-effectiveness of the field, it will be necessary to be able to test all the possible positions and thus select the best of them. Such an approach is inappropriate in practice, because it is consumes to much computation time. An alternative is launching an optimization process which search for the well position that makes it possible to optimize the production of the deposit being studied. However, this approach is also difficult to implement, because it entails thousands of iterations and therefore thousands of reservoir simulations.

The concept of a production indicator map, also called a "quality map" in the literature, was introduced to provide a practical response to the problem of the placement of new wells in a reservoir. It is a two-dimensional map, comprising a set of meshes, in which each mesh is associated with a real value showing how a new well placed in a mesh affects the production or the net present value (NPV) relative to a base case. A production indicator defines an impact on the production of the fluids (hydrocarbons) linked to the addition of a well in the mesh.

To construct this map, it is possible to perform a flow simulation for each mesh where it is possible to place a well. If the reservoir comprises NX and NY meshes on the X and Y axes, the total number of meshes to be examined is NX×NY. From the number of meshes the number of inactive meshes and the number of meshes in which there is already a well for the base case are subtracted. This approach requires a significant computation time when the number of meshes NX×NY is great. Furthermore, since the possible meshes are considered serially one after the other, the interferences between the new wells are not taken into account.

One alternative, proposed by the applicant in the patent application EP 2568110, corresponding to US Published Application 2013/0020131, constructions a map of production indicators determined by interpolation. The chosen interpolation method is dependent on the distance between the mesh being considered and the well closest to that mesh. This method also makes it possible to update the map of production indicators when wells are added sequentially to the reservoir model, without requiring performing new simulations. Consequently, by virtue of this method, the interferences between wells are taken into account, in a manner requiring limited computation time.

This approach nevertheless requires number of flow simulations, and this number becomes all the greater when the number of meshes forming the reservoir model is great. In effect, if the number of simulations concerned initially is too small, the reliability of the result determined from the interpolation method is questionable.

SUMMARY OF THE INVENTION

Thus, the method according to the invention determines a position of wells that makes possible significant improvement operation of an underground formation to produce oil with lesser cost (amount) computation time point of view.

The reduction in the number of reservoir simulations involved in the method according to the invention, compared to the number of simulations required in the prior art, is offset by a physical analysis of the properties of the reservoir model.

Thus, the present invention relates to a method for operating a subterranean formation to produce oil in which at least one well is drilled from which a fluid is produced between a time t0 and a time t1, based on a grid, formed by meshes, representative of the distribution of petrophysical properties of the formation, in which a position of at least one new well to be drilled is determined, with at least the following steps being performed:

a) performing a reservoir simulation based on the grid and a reservoir simulator, from the time t0 to a time t2 which is later than the time t1;

b) based on at least the results of the reservoir simulation, at least one attribute is defined which is representative of the flows in the formation and a classification method is applied to the attributes to group the attributes into classes;

c) a quality indicator value is computed for each of the classes and at least one class is selected in which the indicator is greater than a first predefined threshold;

d) a map representative of the occurrence of the selected class is computed with the occurrence being computed along a predefined curve in the grid, and the cells of meshes of the map are selected in which the occurrence of the selected class is greater than a second predefined threshold; and e) the position of the new well is defined as a function of the positions of the selected cells of meshes.

According to the invention, at least one attribute can be chosen from at least one of height of oil and of gas, at least one of the relative oil, gas and water permeability, the horizontal permeability, the fluid pressure, and at least one of the oil, gas and water saturation.

According to the invention, the curve can be a vertical straight line.

According to the invention, the quality indicator of each class can be computed from average values of the values of the attributes associated with each class.

According to a preferred mode of implementation of the invention, the quality indicator of each class can correspond to a sum for each class of standardized average values of values of at least two of the attributes.

According to the invention, the position of the new well can correspond to the cell chosen from the selected meshes for which an occurrence of the selected class is greatest.

According to the invention, the steps a) to e) can be reiterated, including step a) with a given iteration greater than or equal to 2 being performed by accounting for the position of the new wells added in the preceding iteration.

Advantageously, the reservoir simulation of the step a) can be performed only between the times t1 and t2 from the second iteration.

According to the invention, an optimum number of wells to be drilled, and the order in which to drill the wells between the times t1 and t2, can be determined.

According to the invention, the optimum number of wells to be drilled and the order in which to drill the wells can be determined from an analysis of a trend of the oil production over time resulting from the addition of at least one new well.

According to the invention, the new well can be an injection well or a producing well, vertical or deflected, or perforated over at least part of the height of the well.

Advantageously, uncertainties in the determination of the position of the new well can be taken into account.

Preferentially, the classification method can be the K-means algorithm.

Preferably, the reservoir simulation can be performed between the time t1 and the time t2 by multiplying coefficients applied to productivity indices of the first wells passing through the formation.

Furthermore, the invention relates to a computer program product that can be downloaded from at least one of a communication network and stored on a tangible computer-readable medium which can be executed by a processor, comprising program code instructions for implementing the method when the program is run on a computer.

Advantageously, the operation of drilling wells can be performed at the determined positions.

BRIEF DESCRIPTION OF THE DRAWINGS

Other features and advantages of the method according to the invention will become apparent on reading the following description of nonlimiting exemplary embodiments, with reference to the attached figures described hereinbelow.

DETAILED DESCRIPTION OF THE INVENTION

The method according to the invention makes possible effective operation of a subterranean formation containing hydrocarbons in a reservoir. The method makes possible selection of positions at which to place one or more new wells, which are each producing or injecting with a goal of improving the productivity of the oil reservoir.

Hereinbelow, three distinct times are considered which are t0, t1 and t2. The time t0 represents the initial time, before the reservoir is put into production, the time t1 is the time during which production data among other data, has been collected, and the time t2 is a future time, for which a prediction of the production is required and is to be determined.

The method according to the invention requires a reservoir model representative of the petrophysical properties of the subterranean formation being studied, and a reservoir simulation. The reservoir model observes the data collected up to the time t1. The reservoir model is a three-dimension grid, formed by meshes with each mesh being associated for example with facies, porosity, permeability, water, oil, gas saturation, and other such data.

The method according to the invention comprises at least the following steps:

a) performing a reservoir simulation is based on the grid and a reservoir simulation, from the time t0 to a time t2 which is later than the time t1;

b) based on at least the results of the reservoir simulation, defining at least one attribute representative of flows in the formation and applying a classification method to the attributes to group the attributes into classes;

c) computing a quality indicator value for each of the classes and selecting from the classes at least one class having an indicator greater than a first predefined threshold;

d) computing a map representative of the occurrence of the selected class along a predefined curve in the grid—for which the cells of meshes of the map are selected for which the occurrence of the selected class is greater than a second predefined threshold; and e) defining the position of the new well as a function of the positions of the selected cells of meshes.

The main steps of the present invention are detailed herein below. For illustration purposes, the selected cells are applied to a mature field, in production, already comprising a significant number of wells. The objective is to identify the positions of new wells, which makes possible improvement in the productivity of the reservoir, while limiting the use of reservoir simulation steps to lessen computer computation time.

a) Reservoir Simulation

During this step, a reservoir simulation is performed between a time t0 and a time t2 later than at time t1, based on meshes representative of the petrophysical properties of the reservoir and a reservoir simulation, and for the well positions that are already known. For example, the Puma-Flow® software (IFP Energies nouvelles, France) is a simulator providing simulation of reservoirs in a porous medium in which the succession of computations required by the simulation is executed on a computer. The reservoir simulation makes possible computation, in each mesh, attributes representative of the flow in the subterranean formation being studied, such as at least one of height of oil and height of gas, at least one of the relative oil, the relative gas and relative water permeability, the horizontal permeability, the fluid pressure, and at least one of the oil, the gas and the water saturation.

The reservoir simulation between the times t1 and t2 is predictive and usually involves discontinuities in the oil flow rate curves of the existing wells. An existing well is a well which has been opened before going on to the prediction phase. According to one embodiment of the invention, a well known technique is used that adjusts during the prediction phase, the multiplying coefficients applied to the productivity indices of the existing wells to correct oil flow rate curves of the discontinuities. This step can be done in at least one of manually, by trial and error, in an automated manner, based on a functionality specific to the reservoir simulator, based on an optimization algorithm.

b) Classification of the Attributes

During this step, the goal is to define at least one attribute representative of flows in the subterranean formation being studied, and to apply a classification method to the at least one attributes. At least one attribute is chosen from the properties of the reservoir being measured or simulated, such as at least one of the height of oil and the gas, the relative oil and the relative gas and the water permeability, the horizontal permeability, the fluid pressure, and at least one of the oil the, gas and water saturation.

According to a particular embodiment of the present invention, an attribute can result from an operation applied to properties of the reservoir which is measured or simulated. According to one embodiment of the present invention, the the horizontal permeability of the height of oil is for example computed. According to another embodiment of the invention, an attribute can also result from the computation of the fluid pressure difference between the times t2 and t1 or a difference between the the pressure at time t1 and abort pressure.

According to another particular implementation of the present invention, an additional attribute is a distance between each mesh of the grid a the closest existing well. Advantageously, the distance is an euclidean type.

With attributes characterizing the reservoir being defined, a classification method is applied to at least one of these attributes, to analyze the attributes and separate the attributes into classes. The classification uses a well known method that groups points into a family, with the points of each family exhibiting common characteristics. When applied to attribute values of a grid, the classification groups the meshes of the grid that have closest attribute values. It is then possible to assign to each mesh an indicator specifying the class or even the family, to which it belongs.

In a preferential embodiment of the present invention, the classification is done according to the K-means algorithm, which groups the values of the attributes in K classes in which each class does not overlap another class. A number of classes (or coefficient K) is chosen, generally less than 10, in order to obtain a relatively stable result. This algorithm offers the advantages of conceptual simplicity, speed of execution and low memory size requirements.

According to one embodiment of the present invention, the attributes can be weighted before proceeding with their classification. In this way, it is thus possible to reinforce the impact of certain attributes, such as, for example, the height of oil, compared to others.

The grid that is obtained is three-dimension and is therefore difficult to comprehend. According to a particular implementation of the invention, to simplify the analysis of the information associated with the grid, a two-dimensional map is constructed that presents, for each mesh, the indicator of the class for which the occurrence is greatest along points on a given curve. A map identifying regions is thus obtained, distinguishing regions of the reservoir for which the attributes belong to the same class. The meshes belonging to the same region are therefore characterized as having closely related or similar attribute values.

According to a particular implementation of the invention, a curve, of predefined form, is chosen. The chosen curve is placed in the three dimensional mesh of the grid. The vertical position of the mesh placed in the three dimensional grid defines a level along which the map identifying regions is constructed. The map identifying regions is formed by two-dimensional meshes. The limits of the meshes of the map identify regions corresponding to the limits of the meshes of the grid for the level which is chosen. Then, the number of meshes of the grid, associated with each of the classes being considered, through which the duly positioned curve passes is counted. The indicator of the class having the greatest count of meshes is assigned to the mesh in the map identifying regions for which the limits correspond to those of the chosen mesh in the grid. Then, the operation is repeated for all the meshes of the grid along the level being considered. A two-dimensional map is produced which is, formed by meshes each containing an indicator of the class having the greatest count.

According to one embodiment of the present invention, the curve is a vertical straight line. The map identifying regions thus represents the indicators having a greatest number of classes per column in the grid considered.

According to a preferred embodiment of the present invention, the level along which the map identifying regions is computed corresponds to a top face of the grid under consideration.

Advantageously, the result of the computation of maps identifying regions can be displayed on a computer screen. This feature makes it possible, optionally, to modify the classification parameters to obtain classes that are clearly distinct from one another.

Figure 1:
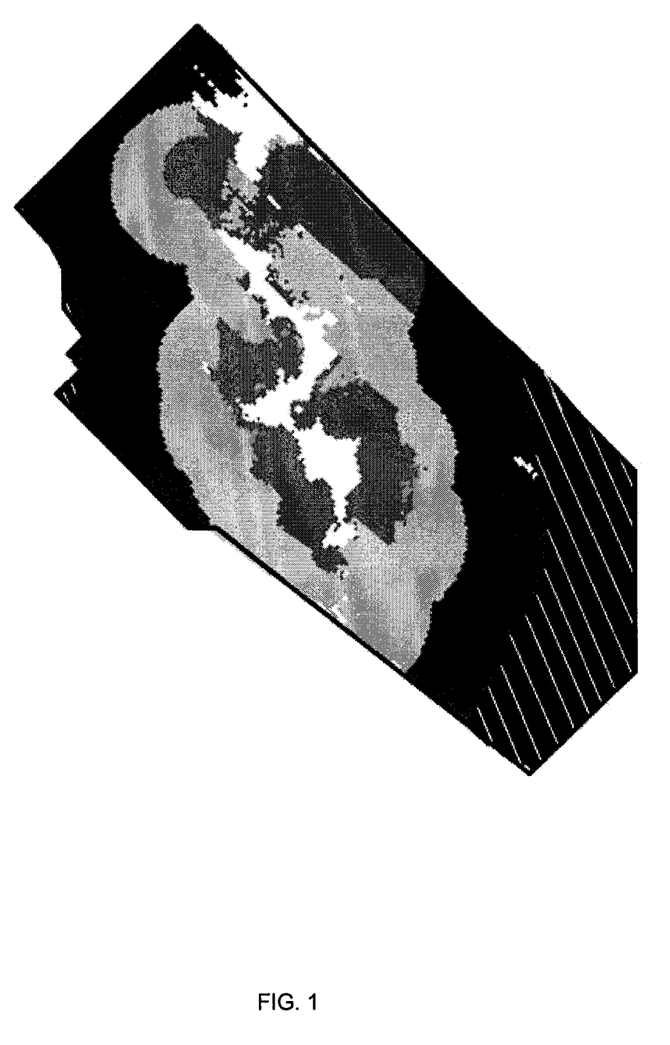
FIG. 1 presents a map of identification of the regions obtained by an attribute classification method.

FIG. 1 represents an example of a map identifying regions obtained by application of a classification method to attributes obtained from the example described at the start of the description above. The number of classes has been set at five for the application of the classification method, and a vertical straight line has been used to construct the map identifying regions. On this map, five different regions are distinguished, reflecting the five majority classes per vertical column in the three-dimension grid.

It should be noted that certain meshes are not taken into account in this analysis, for example the dead meshes (that is to say the meshes of zero porosity) or the meshes under the water/oil interface.

c) Computation of a Class Quality Indicator

During this step, an indicator representative of the quality of each of the classes derived from the attribute classification step described in the step b) is computed.

According to one implementation of the present invention, a quality indicator representative of a class is constructed from averages of values of the attributes associated with the class under consideration. Table 1 presents the average values, computed over a number NS of samples present in the classes denoted C1 to C5, of different attributes wherein ROIL_3D corresponds to the 3D height of oil; HOIL_2D corresponds to the 2D height of oil; HUKH_3D corresponds to the product of the thickness of the meshes by the absolute horizontal permeability; KHKRO-3D corresponds to the product of the horizontal permeability by the relative oil permeability, DP_3D corresponds to the pressure difference between the times t2 and t1, and DIST 3D corresponds to the 3D distance to the closest existing well.

According to a particular implementation of the present invention, a quality indicator is constructed that is representative of each of the classes as follows:

For each attribute, the average value per class of the values taken by this attribute is computed (Table 1). For a given attribute, an average attribute value is thus obtained for each of the classes.

For each attribute, the average values per class are standardized (Table 2). There is thus obtained, for a given attribute, average values per class of between 0 and 1. If necessary, a correction is applied to these standardized average values, so that the values closest to 1 correspond to a high oil potential.

For each class, the standardized average values of at least two attributes of this class are aggregated. Table 3 presents the sum of the standardized averages of the attributes ROIL_2D, HUKH_3D, KHKRO-3, DP_3D and DIST 3D. According to a particular embodiment of the present invention, weighting is applied to the attributes prior to the aggregation of the standardized averages, which assigns a more significant weight to specific attributes compared to others in the computation of the quality indicator.

Then, once a quality indicator is computed for each of the classes of interest, it is possible to proceed with the analysis of their quality indicator. Thus, the quality indicator makes it possible to order the classes and identify the class or classes, and therefore the region or regions of the reservoir, for which the oil potential is the greatest. For example, according to Table 3, the class C2 appears to be the most advantageous class, that is to say the one exhibiting the best oil potential.

According to the method according to the invention, once a quality indicator is computed for each class, the class or classes for which the quality indicator is greater than a predefined threshold is/are selected.

According to one embodiment of the present invention, the class or classes for which the quality indicator is 150% greater than the average of the quality indicators is/are selected.

According to a preferred embodiment of the present invention, the class for which the quality indicator is the highest is selected.

Advantageously, the result of the quality indicator computation is displayed first on a computer screen. This feature makes it possible for choosing a relevant threshold beyond which the class or classes is/are considered to have an interesting oil potential.

TABLE 1

|  | C1 | C2 | C3 | C4 | C5 |
| --- | --- | --- | --- | --- | --- |
| NS | 31915 | 3362 | 13289 | 4748 | 8103 |
| HOIL_3D | 0.34 | 1.26 | 0.50 | 0.76 | 1.29 |
| HOIL_2D | 4.81 | 7.36 | 5.26 | 4.39 | 9.16 |
| HUKH_3D | 680.55 | 2096.40 | 951.21 | 1222.10 | 2023.90 |
| KHKRO_3D | 5.70 | 177.25 | 17.09 | 43.00 | 79.44 |
| DP_3D | −386.57 | −112.08 | −134.44 | −247.13 | −463.97 |
| DIST_3D | 605.04 | 2173.80 | 1157.40 | 4488.20 | 532.02 |

TABLE 2

|  | C1 | C2 | C3 | C4 | C5 |
| --- | --- | --- | --- | --- | --- |
| HOIL_3D | 0.00 | 0.97 | 0.17 | 0.44 | 1.00 |
| HOIL_2D | 0.09 | 0.62 | 0.18 | 0.00 | 1.00 |
| HUKH_3D | 0.00 | 1.00 | 0.19 | 0.38 | 0.95 |
| KHKRO_3D | 0.00 | 1.00 | 0.07 | 0.22 | 0.43 |
| DP_3D | 0.22 | 1.00 | 0.94 | 0.62 | 0.00 |
| DIST_3D | 0.02 | 0.41 | 0.16 | 1.00 | 0.00 |

TABLE 3

|  | C1 | C2 | C3 | C4 | C5 |
| --- | --- | --- | --- | --- | --- |
| Quality indicator | 0.33 | 4.04 | 1.53 | 2.22 | 2.38 |
| Classification | 5 | 1 | 4 | 3 | 2 | d) Construction of a Class Occurrence Map

During this step, a two-dimensional map is constructed representative of the occurrence, along a given curve in the three dimensional grid, of at least one class deriving from the step b). More specifically, a two-dimensional map is constructed that exhibits, for each mesh, the occurrence of a given class along a curve passing through the grid.

According to a particular implementation of the invention, a curve of predefined form is considered and this curve is placed in a two-dimensional mesh of the three dimensional grid. The vertical position of this mesh in the grid defines a reference level, or a vertical position at which the two-dimensional occurrence map is constructed. The occurrence map is formed by two-dimensional meshes with the limits of the meshes of the occurrence map corresponding to the limits of the meshes of the grid for the chosen reference level or reference position. Then, for a given class, the number of meshes of the grid associated with the class being considered, through which passes the duly positioned curve, is counted. The duly computed occurrence is assigned to the cell of mesh in the occurrence map for which the limits correspond to those of the mesh chosen in the grid. Then, the operation is repeated for all the cells of the grid along the reference level being considered. A two-dimensional map is obtained, formed by meshes wherein each mesh contains the occurrence of the class being considered. According to a preferred embodiment of the present invention, the level along which the occurrence map is computed corresponds to the top face of the grid under consideration. Advantageously, the reference level chosen to construct the occurrence map is the same as the level chosen to construct the map identifying regions.

According to one embodiment of the present invention, an occurrence map is constructed for each class deriving from the step b).

According to a preferred embodiment of the present invention, an occurrence map is constructed for the class or classes selected in the step c).

According to a particular implementation of the present invention, the curve is a vertical straight line. This implementation is in particular used when the goal is to position a vertical well.

Advantageously, the curve chosen to construct the occurrence map has the same form as the curve chosen to construct the map identifying regions.

Figure 2:
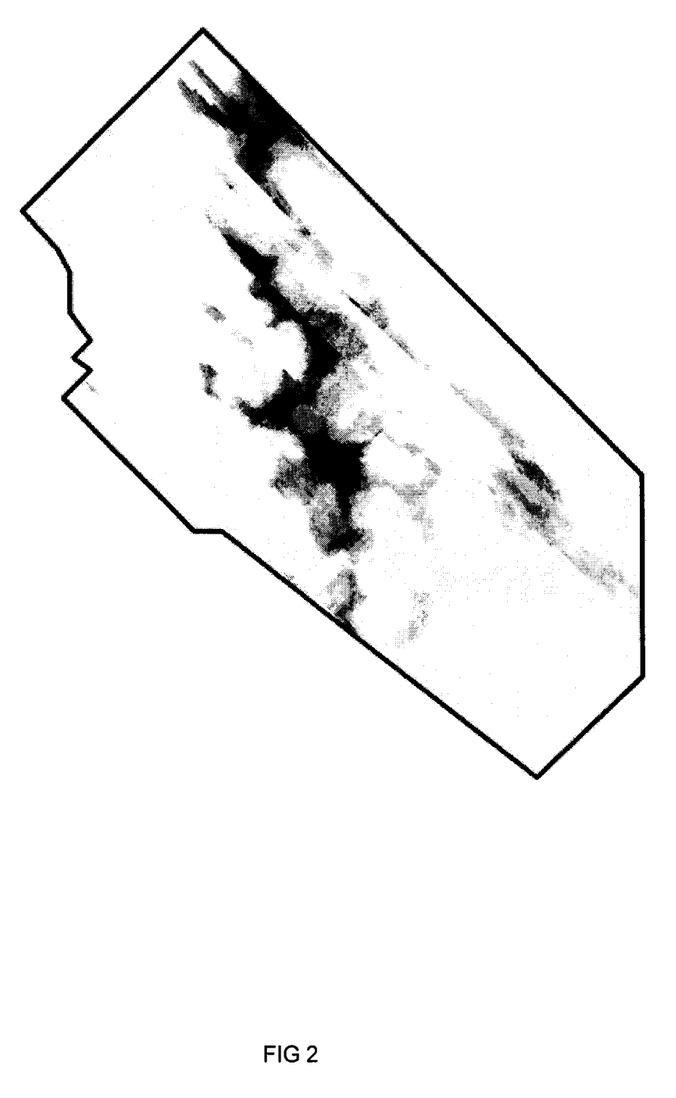
FIG. 2 presents a map of occurrence of the class presented in white in FIG. 1.

An example of occurrence map for the class presented in white in FIG. 1 is presented in FIG. 2. The light colors correspond to the areas for which the occurrence of the class being studied is low, and the dark colors correspond to the areas for which the occurrence of the class being studied is highest.

Then, for at least one class selected in the step c), the meshes, in the occurrence map of the class under consideration, which are associated with an occurrence greater than a predefined threshold, are selected.

Advantageously, the occurrence map or maps for the class or classes selected is/are displayed on a computer screen. This feature can also enable defining a threshold beyond which the occurrence of a given class is judged sufficient for this class to be considered as interesting from an oil potential point of view.

According to a particular implementation of the invention, the value of the threshold relating to the occurrence will be equal to 75%.

According to a preferred embodiment of the invention, for each class selected in the step c), the meshes of the occurrence map constructed for the related class for which the occurrence of the selected class is greatest.

Figure 3:
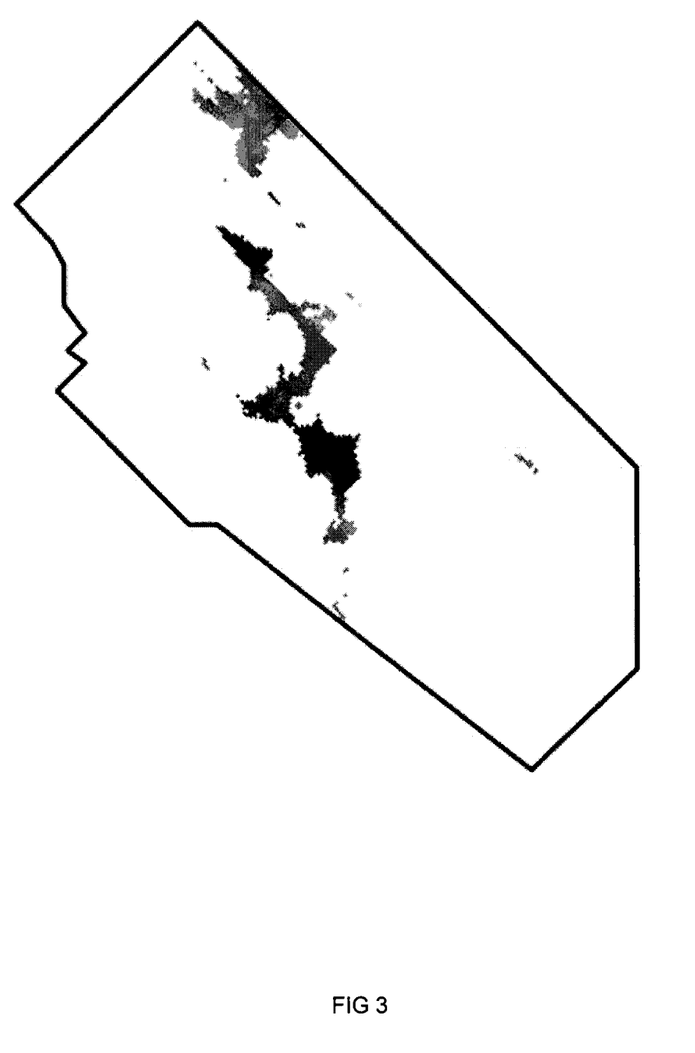
FIG. 3 presents the values of the attribute corresponding to the height of oil in the meshes selected according to the method according to the invention.

According to another embodiment of the present invention, the selection of the meshes as described previously is refined as a function of the value of at least one relevant attribute. For example, if the height of oil is chosen as relevant attribute, from the meshes selected, those which are associated with a height of oil greater than a certain threshold will be chosen. FIG. 3 shows, for example, the map of distribution of the height of oil in the meshes selected on the basis of the occurrence of the classes as described previously. The darkest colors show the areas where the height of oil is the greatest, and therefore the areas where the oil potential is a priori the greatest.

e) Positioning of the Wells

During this step, the goal is to determine the position of at least one new well in the grid.

According to an embodiment of the present invention in which a single new well is placed, the single new well is positioned in the cell of mesh, from the meshes selected in the step d), that has the greatest number of occurrences. Thus, the mesh corresponding to the class having the best oil potential that is present most often along a given curve such as a straight vertical line is selected.

According to an embodiment of the present invention in which p new wells are placed, the positioning of p new wells in the p meshes, out of the meshes selected in the step d), is for the wells having the greatest number of occurrences.

According to a particular embodiment of the present invention, the maps, for example identifying regions and occurrence, are displayed on a computer screen to refine the positioning of the new well or wells to be drilled.

According to another embodiment of the present invention, at least one new well is placed in proximity to the selected meshes.

According to an embodiment of the present invention, the added wells are drilled above the water-oil interface. Advantageously, the display of the values of the attributes along the predefined curve makes possible specifying the level of drilling of the wells.

Variants

Successive Positioning of New Wells.

During this step, the goal is to define the manner in which one or more new wells are successively placed.

In the case where a number P of new wells are to be placed, the new wells can be placed all together or sequentially, one by one, or in a group of p wells by group of p wells, where p is a number less than or equal to P. The p new wells can be added at the time t1, or at time intervals Δt from t1 with Δt corresponding for example to 1 month. The advantage of placing the wells in groups is to reduce the computation time required by the successive flow simulations.

This step is described hereinbelow in the case of P new wells, added in groups of p wells, in an order to be defined. In this case, the method according to the invention can be performed as follows:

The steps a) to e) of the method according to the invention are applied as previously described to determine the position of the first group of p wells;

Then, the steps a) to e) are reiterated with the reservoir simulation step a) being applied by accounting for the position of the p wells that has been determined.

Figure 4:
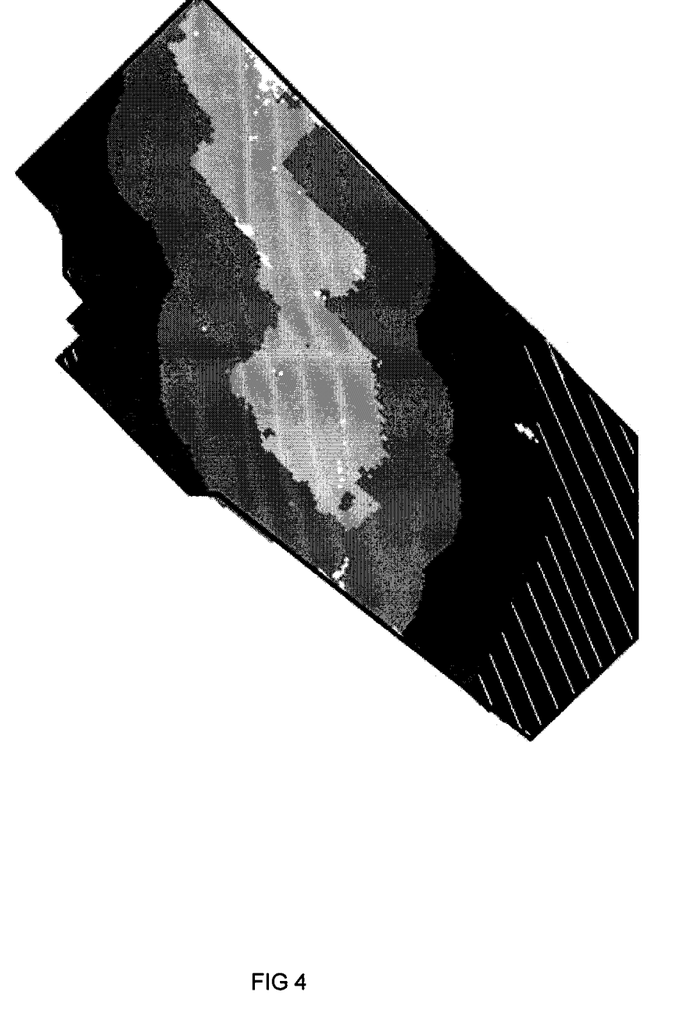
FIG. 4 presents the update of a map identifying the regions after the successive addition of 25 wells according to the method according to the invention.

In this way, on each iteration I, such that of the method according to the invention, the values of the attributes identified for the implementation of the present invention are updated. FIG. 4 shows the map of the attributes of the preceding example updated after the addition of 25 wells, at a rate of one well per month. According to an embodiment of the present invention, the grid of the distances to the closest well is also updated. The classification performed in the step b) of an iteration I, with I≥2, therefore accounts for the impact of the p wells positioned in the step I−1. Then, the process is repeated until the P wells have been added.

Advantageously, the reservoir simulation implemented in the step a) is performed only between the times t1 and t2 for Optimum Number of Wells to be Drilled and Order of Placement of the Wells During this step, the goal is to define the optimum number of wells to be drilled for the reservoir under study, and the order in which to drill these wells.

Figure 5:
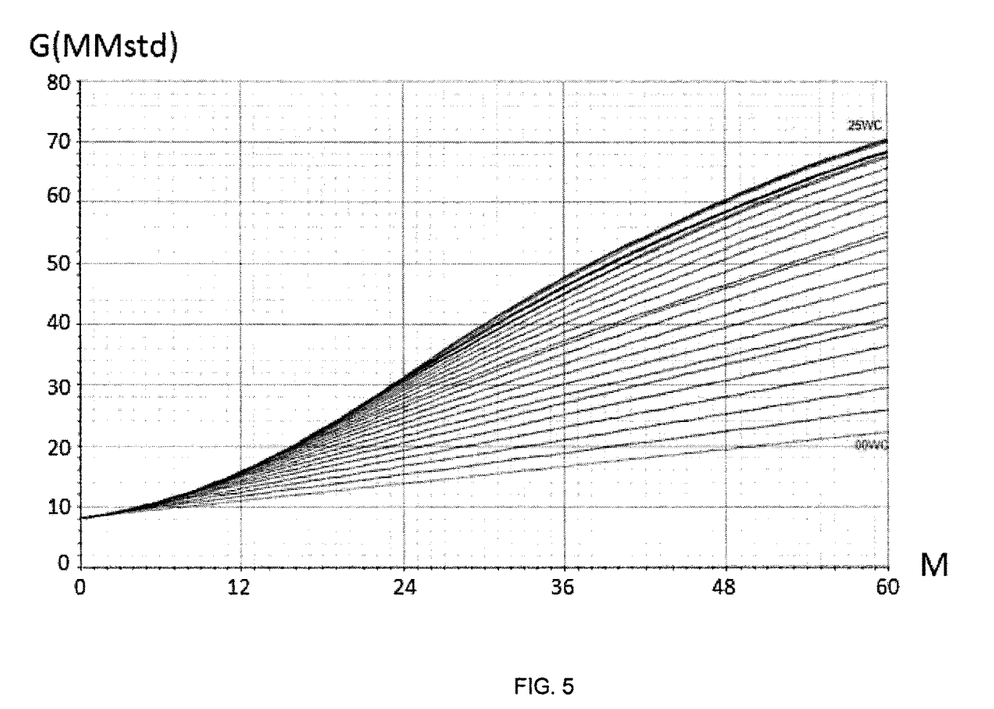
FIG. 5 illustrates a series of 25 curves wherein each curve corresponds to a gain G in volume of oil (in million stock tank barrels) as a function of a number of months M, produced by the successive addition of 25 producing wells, at a rate of one well per month between a time t1 and a time t2, according to the method according to the invention.

According to an embodiment of the present invention in which P wells have been successively positioned as described previously, the oil production is assessed over the time linked to each addition of a well or of a group of wells via a reservoir simulation. FIG. 5 presents a series of 25 curves derived from the application of the method according to the invention in the case being studied wherein each curve corresponds to the aggregate gain in volume of oil obtained by the successive addition of 25 wells between the times t1 and t2, at a rate of one well per month.

Figure 6:
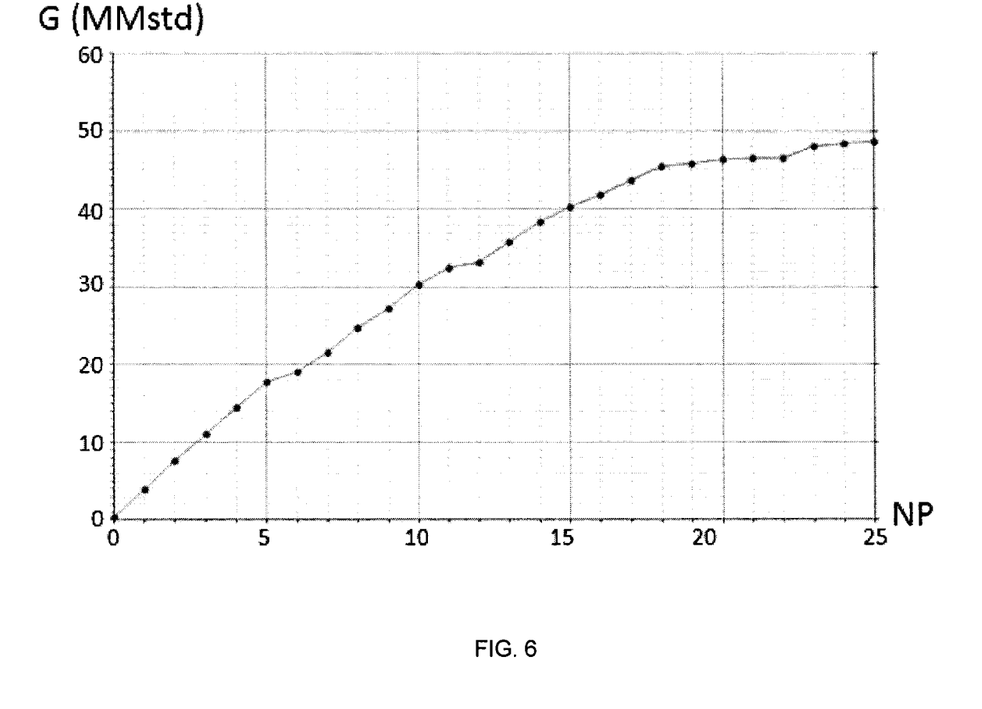
FIG. 6 presents the gain G in volume of oil (in million stock tank barrels) produced at the time t2 as a function of the number of wells NP added according to the method according to the invention.

According to a preferred embodiment of the present invention, the increment of oil produced for each well or for each group of wells added is estimated. The analysis of this curve makes it possible to recommend an optimum number of wells to be drilled since, from a certain number of wells, the addition of a new well contributes only modestly to increasing the production. FIG. 6 presents the aggregate gain in oil produced as a function of the number of new wells added. It can thus be seen that the oil aggregate curve reaches a plateau from the 18th well added. It should also be noted that, at a given moment, the gain in production linked to the addition of a well can be less than the cost of its drilling. It is also observed that certain wells which are added provide a greater gain in production than others and that these wells are not necessarily those added first. For example, in FIG. 6, the well 7 appears to provide a greater oil increment than the well 6. Thus, the addition of the wells can be reordered chronologically as a function of the computed gain in production. The positions of the wells remain the same as those determined previously.

Advantageously, a reservoir simulation will be able to be relaunched, taking into account the optimum number of wells to be drilled and the chronological order thus determined in order to obtain a new assessment of the production of oil and confirm or not the choices made using the method according to the invention. If the choices do not prove to be optimal, it is possible to relaunch the method according to the invention to determine, for example, new well positions, or even change the order or the number of wells to be drilled.

In practice, a very long time period t2-t1 may be considered, often of the order of 30 years. It is possible to set a limit of a shorter period, of a few years, to perform the well positioning study according to the method according to the invention. Once the study has been performed, the position of the wells and the chronological order of addition of the wells being defined, it will be possible to simulate the flows with all of the wells up to a greater time t2.

In the context of the example covered to describe the steps of the present invention, the method according to the invention needs only 25 reservoir simulations to place 25 new wells, since the 25 wells have been added one by one, month after month. This number of reservoir simulations could however have been reduced, for example by adding the wells 3 by 3. There would then have been only 8 uses of the flow simulator. Despite that, the reduction in computation time is significant compared to the prior art. In effect, if a conventional optimization of positioning of wells had been launched, the number of flow simulations would have been of the order of a few hundred. And if an approach based on the construction of a map of production indicators determined by interpolation disclosed in EP 2568110 with counterparts to US published application 2013/0020131 had been used, the number of reservoir simulations would have been of the order of at least fifty.

Inclusion of Uncertainties

The method according to the invention can take account for uncertainties established on a basis of reliability of information known from the existing wells.

The reservoir model used by the method according to the invention is a model constrained by the production data acquired during the period t0-t1. Some wells may yet be better adjusted in certain areas than in others. The quality of the adjustment directly reflects this notion of uncertainty. The better the wells are adjusted, the lower the uncertainty becomes in the areas around these wells.

According to an embodiment of the present invention, the uncertainty at a given well is defined by the difference, weighted or not, of least square type between production data measured at the well in question and production data simulated for this same well. The result thereof is that, when the error is small, the uncertainty is low.

According to an implementation of the present invention, a map of uncertainties is created by interpolating the uncertainties estimated at the wells. A two-dimensional map is thus created, which is formed by meshes with each mesh being associated with an uncertainty. Advantageously, the limits of the meshes and the level on a vertical axis of this map are the same as those of the map identifying regions and/or those of the occurrence map. According to one embodiment, this interpolation is performed by a well known kriging method.

According to one embodiment of the present invention, the duly computed uncertainties are used to weight the attributes, such as the height of oil, before the classification step b).

According to one embodiment of the present invention, the selection of the meshes that are candidates for the positioning of at least one well accounts for the duly computed uncertainties. Thus, if a mesh included in the candidate meshes at the end of the step d) is associated with an uncertainty greater than a predefined threshold, then this mesh is not selected.

According to one embodiment of the present invention, the map of uncertainties, computed as described previously, is displayed on a computer screen. Thus, when reference is made to the map identifying regions and the occurrence map is selected the position of a well, checking can be performed to determine whether this position is in an area where the uncertainty is great or not. Thus, a position situated in an area where the uncertainty is greater than a set threshold would not be retained.

The invention claimed is:

1. A method for producing fluid from a subterranean formation through which passes at least one drilled operation well from which fluid is produced based on production between times t0 and t1, based on a three-dimension grid formed by meshes representative of a distribution of petrophysical properties of the subterranean formation, in which a position of at least one new operation well-being determined and drilled into the subterranean formation to produce fluid from the subterranean formation, comprising:
   a) performing a single reservoir simulation based on the grid with a reservoir simulator from time t0 to time t2 which is later than time t1;
   b) based on at least results of the reservoir simulation, defining attributes representative of flow of the fluid in the subterranean formation and classifying the attributes into classes by applying a classification method;

c) computing a quality indicator value for each of the classes from at least results of the single reservoir simulation;
d) selecting at least one class having a quality indicator greater than a first threshold;
e) computing a two-dimensional map representative of occurrence of the selected at least one class along a predefined curve, comprising:
  i) placing the predefined curve in the three-dimension grid, a vertical position of a point taken along the predefined curve in the three-dimension grid defining a reference level in the three-dimension grid level along which the two-dimensional map representative of occurrence is constructed, wherein the two-dimensional map representative of occurrence corresponding to the horizontal mesh of the three-dimension grid at the reference level;
  ii) counting a number of meshes of the three-dimension grid associated with the at least selected class and which are passed through by the predefined curve which is placed in the three-dimension grid such that the point of the predefined curve is placed in a cell of the horizontal mesh of the three-dimension grid, and assigning the counted number of meshes associated with the at least selected class to the cell of the two-dimensional map representative of occurrence of the selected at least one class;
  iii) repeating steps (i-ii) for each cell of the two-dimensional map representative of occurrence of the selected at least one class;
f) selecting cells of the two-dimensional map representative of occurrence of the selected at least one class for which a number of occurrences is greater in number than a second threshold;
g) defining a position at which at least one new operation well is to be drilled into the subterranean formation as a function of positions of the selected cells of the two-dimensional map representative of occurrence of the selected at least one class; and
h) drilling the at least one new operation well at the defined position for the at least one new operation well to be drilled in the subterranean formation and producing the fluid from the at least one new drilled operation well to produce the fluid from the subterranean formation with the at least one new operation well-being an injection well or a production well with the wells being vertical over at least part of a height thereof.

2. A method according to claim 1, comprising choosing at least one attribute from a height of at least one of oil and gas in the subterranean formation, at least one of relative oil, gas and water permeability, horizontal permeability, fluid pressure, and at least one of oil saturation, gas saturation and water saturation.

3. A method according to claim 1, wherein the curve is a vertical straight line.

4. A method according to claim 2, wherein the curve is a vertical straight line.

5. A method according to claim 1, wherein the quality indicator of each class is computed from an average of values of attributes associated with each class.

6. A method according to claim 2, wherein the quality indicator of each class is computed from an average of values of attributes associated with each class.

7. A method according to claim 3, wherein the quality indicator of each class is computed from an average of values of attributes associated with each class.

8. A method according to claim 4, wherein the quality indicator of each class is computed from average values of attributes associated with each class.

9. A method according claim 1, wherein the quality indicator value of each class corresponds to a sum for each class of standardized average values of at least two attributes.

10. A method according claim 2, wherein the quality indicator value of each class corresponds to a sum for each class of standardized average values of at least two attributes.

11. A method according claim 3, wherein the quality indicator value of each class corresponds to a sum for each class of standardized average values of at least two attributes.

12. A method according claim 4, wherein the quality indicator value of each class corresponds to a sum for each class of standardized average values of at least two attributes.

13. A method according to claim 1, wherein a position of each new operation well corresponds to a mesh of the selected meshes for which occurrence of the selected class is greatest in number.

14. A method according to claim 2, wherein a position of each new operation well corresponds to a mesh of the selected meshes for which occurrence of the selected class is greatest in number.

15. A method according to claim 3, wherein a position of each new operation well corresponds to a mesh of the selected meshes for which occurrence of the selected class is greatest in number.

16. A method according to claim 5, wherein a position of each new operation well corresponds to a mesh of the selected meshes for which occurrence of the selected class is greatest in number.

17. A method according to claim 8, wherein a position of each new operation well corresponds to a mesh of the selected meshes for which occurrence of the selected class is greatest in number.

18. A method according to claim 1 comprising:
reiterating steps a) to e) wherein step a) includes at least two iterations which account for a position of each new operation well added in a preceding iteration.

19. A method according to claim 2, comprising:
reiterating steps a) to e) wherein step a) includes at least two iterations which account for a position of each new operation well added in a preceding iteration.

20. A method according to claim 3, comprising:
reiterating steps a) to e) wherein step a) includes at least two iterations which account for a position of each new operation well added in a preceding iteration.

21. A method according to claim 5, comprising:
reiterating steps a) to e) wherein step a) includes at least two iterations which account for a position of each new operation well added in a preceding iteration.

22. A method according to claim 8, comprising:
reiterating steps a) to e) wherein step a) includes at least two iterations which account for a position of each new operation well added in a preceding iteration.

23. A method according to claim 12, comprising:
reiterating steps a) to e) wherein step a) includes at least two iterations which account for a position of each new operation well added in a preceding iteration.

24. A method according to claim 16, wherein the reservoir simulation is performed only between times t1 and t2.

25. A method according to claim 16, comprising:
determining an optimum number of new operation wells to be drilled and determining an order in which to drill the optimum number of new operation wells between the times t1 and t2.

26. A method according to claim 22, comprising:
determining an optimum number of new wells to be drilled and determining an order in which to drill the new wells between the times t1 and t2.

27. A method according to claim 23, comprising:
determining an optimum number of new wells to be drilled and an order in which to drill the optimum number of new wells from an analysis of a trend in oil production over time resulting from the addition of at least one new well.

28. A method according to claim 1, wherein each new well is an injection well or a production well with each new well being vertical or deflected and is drilled over at least part of a height of the oil or gas in the subterranean formation.

29. A method according to claim 1, comprising:
accounting for uncertainties in a determination of a position of the at least one new operation well to be drilled.

30. A method according to claim 1, wherein the classifying of the attributes uses a K-means algorithm.

31. A method according to claim 1, wherein the reservoir simulation is performed between the times t1 and by multiplying coefficients applied to productivity indices of a first well passing through the subterranean formation.

32. A computer program product that can be downloaded from a communication network, stored on a non-transitory computer-readable medium which can be executed by a processor, comprising program code instructions for implementing the method steps a) to f) according to claim 1, when the program is executed by the processor.

* * * * *